United States Patent
Jiang

(10) Patent No.: US 10,497,614 B2
(45) Date of Patent: Dec. 3, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Li Jiang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/006,053

(22) Filed: Jun. 12, 2018

(65) Prior Publication Data

US 2018/0294180 A1 Oct. 11, 2018

(30) Foreign Application Priority Data

Jun. 15, 2017 (CN) .......................... 2017 1 0451766

(51) Int. Cl.
*H01L 21/768* (2006.01)
*H01L 23/532* (2006.01)
(Continued)

(52) U.S. Cl.
CPC ...... *H01L 21/7684* (2013.01); *H01L 21/3212* (2013.01); *H01L 21/76846* (2013.01);
(Continued)

(58) Field of Classification Search
CPC ............. H01L 21/7684; H01L 21/3212; H01L 21/76846; H01L 21/76877; H01L 23/5283; H01L 23/53238; H01L 23/53242
See application file for complete search history.

(56) References Cited

U.S. PATENT DOCUMENTS

2006/0102872 A1* 5/2006 Liu .......................... B23H 5/08
  252/79.1
2007/0059919 A1* 3/2007 Ooka ................ H01L 21/76808
  438/618
(Continued)

*Primary Examiner* — Fernando L Toledo
*Assistant Examiner* — Neil R Prasad
(74) *Attorney, Agent, or Firm* — Anova Law Group, PLLC

(57) ABSTRACT

Semiconductor structures and fabrication methods are provided. An exemplary fabrication method includes providing a base substrate; forming a dielectric layer having an opening on the base substrate; forming a Ruthenium (Ru)-containing layer on side surfaces and a bottom of the opening and on a top surface of the dielectric layer; forming a Copper (Cu) containing layer to fill the opening and cover the Ruthenium (Ru)-containing layer; performing a first chemical mechanical polishing (CMP) step to remove a first partial thickness of the Copper (Cu)-containing layer; performing a second CMP step using a polishing slurry containing a Cu-corrosion-inhibitor to remove a second partial thickness of the Copper (Cu)-containing layer above the Ruthenium (Ru)-containing layer; and performing a third CMP step using a polishing slurry containing a Cu-corrosion-inhibitor to remove a third partial thickness of the Copper (Cu)-containing layer above the dielectric layer.

19 Claims, 4 Drawing Sheets

(51) Int. Cl.
*H01L 23/528* (2006.01)
*H01L 21/321* (2006.01)
(52) U.S. Cl.
CPC .. *H01L 21/76858* (2013.01); *H01L 21/76877* (2013.01); *H01L 23/5283* (2013.01); *H01L 23/53238* (2013.01); *H01L 23/53242* (2013.01)

(56) References Cited

U.S. PATENT DOCUMENTS

2010/0007022 A1* 1/2010 Tarumi ................ H01L 21/2855
　　　　　　　　　　　　　　　　　　　257/751
2010/0227470 A1* 9/2010 Nagano ............. H01L 21/02063
　　　　　　　　　　　　　　　　　　　438/627

\* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710451766.5, filed on Jun. 15, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods.

BACKGROUND

With the continuous development of integrated circuit (IC) manufacturing technologies, the copper (Cu) interconnect has been widely used in the back-end-of-line (BEOL) process. Comparing with the aluminum (Al) interconnect, the resistivity of Cu in the Cu interconnect structure is relatively low; and the anti-electromigration ability is higher.

With the continuous shrinking of the critical dimension (CD) of devices, to reduce the resistance-capacitance (RC) delay, it requires to increase the conductivity of the interconnect structure. Thus, the seed-free Cu interconnect technique has attracted more and more attentions. The conventional adhesion barrier layer has a relatively high resistivity; and it cannot be used as the seed layer for directly electroplating Cu. However, ruthenium (Ru) has a lower resistivity than Cu; a better adhesion with Cu; and is able to achieve a direct electroplating of Cu. Thus, Ruthenium (Ru)-containing layer has been gradually introduced in the Cu interconnect technique; and the Ruthenium (Ru)-containing layer can be used as the wetting layer of the Copper (Cu)-containing layer.

However, introducing the Ruthenium (Ru)-containing layer is easy to deteriorate the quality and the performance of the Cu interconnect structure. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a base substrate; forming a dielectric layer having an opening on the base substrate; forming a Ruthenium (Ru)-containing layer on side surfaces and a bottom of the opening and on a top surface of the dielectric layer; forming a Copper (Cu) containing layer to fill the opening and cover the Ruthenium (Ru)-containing layer; performing a first chemical mechanical polishing (CMP) step to remove a first partial thickness of the Copper (Cu)-containing layer; performing a second CMP step using a polishing slurry containing a Cu-corrosion-inhibitor to remove a second partial thickness of the Copper (Cu)-containing layer above the Ruthenium (Ru)-containing layer; and performing a third CMP step using a polishing slurry containing a Cu-corrosion-inhibitor to remove a third partial thickness of the Copper (Cu)-containing layer above the dielectric layer.

Another aspect of the present disclosure includes a semiconductor structure. The semiconductor structure includes a base substrate; a dielectric layer on the base substrate; a copper (Cu) interconnect structure passing through the dielectric layer; a Ruthenium (Ru)-containing layer between the Cu interconnect structure and the dielectric layer and between the Cu interconnect structure and the base substrate; an adhesion barrier layer between the dielectric layer and the Ruthenium (Ru)-containing layer; and a reaction barrier layer between the adhesion barrier layer and the Ruthenium (Ru)-containing layer. The Cu interconnect structure is formed by forming an opening passing through the dielectric layer; forming the Ruthenium (Ru)-containing layer on side surfaces and a bottom of the opening and on a top surface of the dielectric layer; forming a Copper (Cu)-containing layer on the Ruthenium (Ru)-containing layer; performing a first chemical mechanical polishing (CMP) step to remove a first partial thickness of the Copper (Cu)-containing layer; performing a second CMP step using a polishing slurry containing a Cu-corrosion-inhibitor to remove a second partial thickness of the Copper (Cu)-containing layer above the Ruthenium (Ru)-containing layer; and performing a third CMP step using a polishing slurry including a Cu-corrosion-inhibitor to remove a third partial thickness of the Copper (Cu)-containing layer above the dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Semiconductor structures are often formed by providing a base substrate having a dielectric layer with an opening; forming a ruthenium (Ru) layer on the bottom and the side surfaces of the opening and covering the top surface of the dielectric layer; forming a copper (Cu) layer to fill the opening and cover the Ruthenium (Ru)-containing layer; and performing a chemical mechanical polishing (CMP) process to remove the Copper (Cu)-containing layer and the Ruthenium (Ru)-containing layer above the top surface of the interlayer dielectric layer. The remaining Copper (Cu)-containing layer in the opening is configured as a Cu interconnect structure.

Because Cu and Ru has a potential difference and Cu is more active than Ru, Cu is easier to be etched in the CMP process as copper functions as a cathode of the etching electrodes in the polishing slurry of the CMP process. Accordingly, the quality and the performance of the Cu interconnect structure may be reduced.

The present disclosure provides a semiconductor structure and a fabrication method of the semiconductor structure. In the disclosed fabrication method, during CMPs, a Cu-corrosion-inhibitor (e.g., a Cu-etching-inhibitor) is added in the polishing slurry. Accordingly, the probability for Cu to have an etching issue may be reduced.

Figure 6:
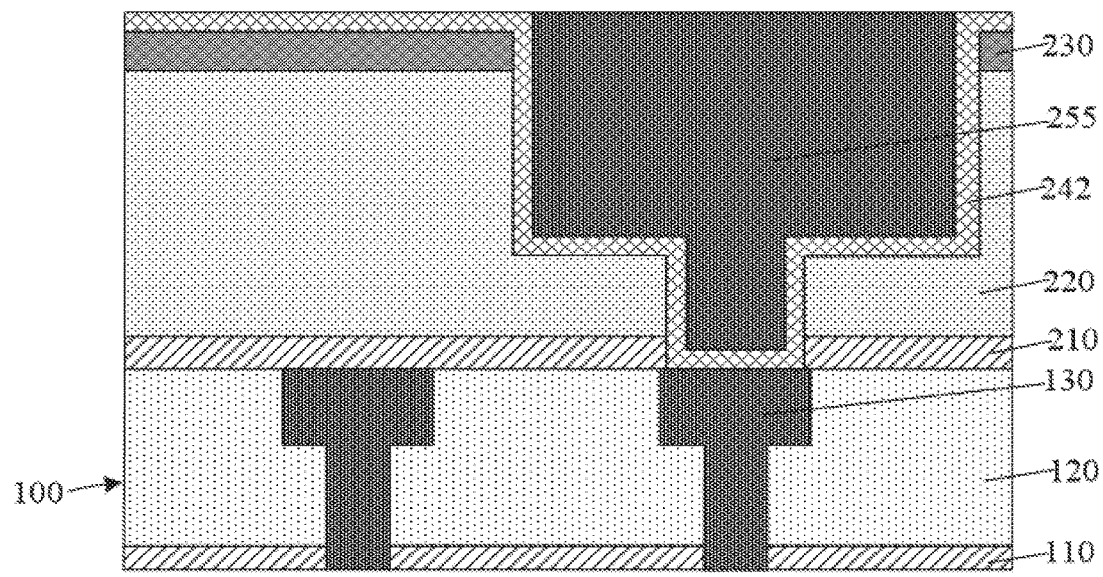
Figure 7:
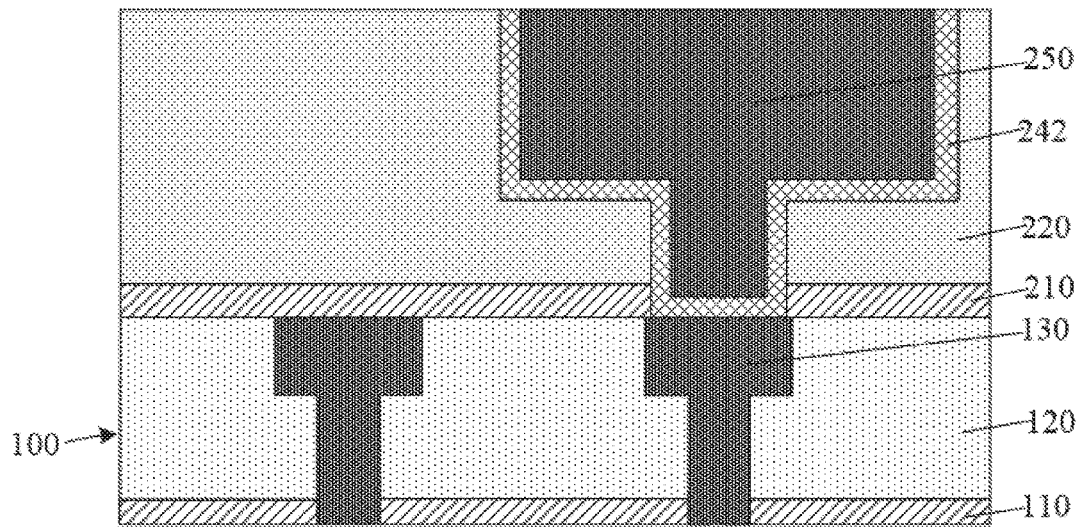
Figure 8:
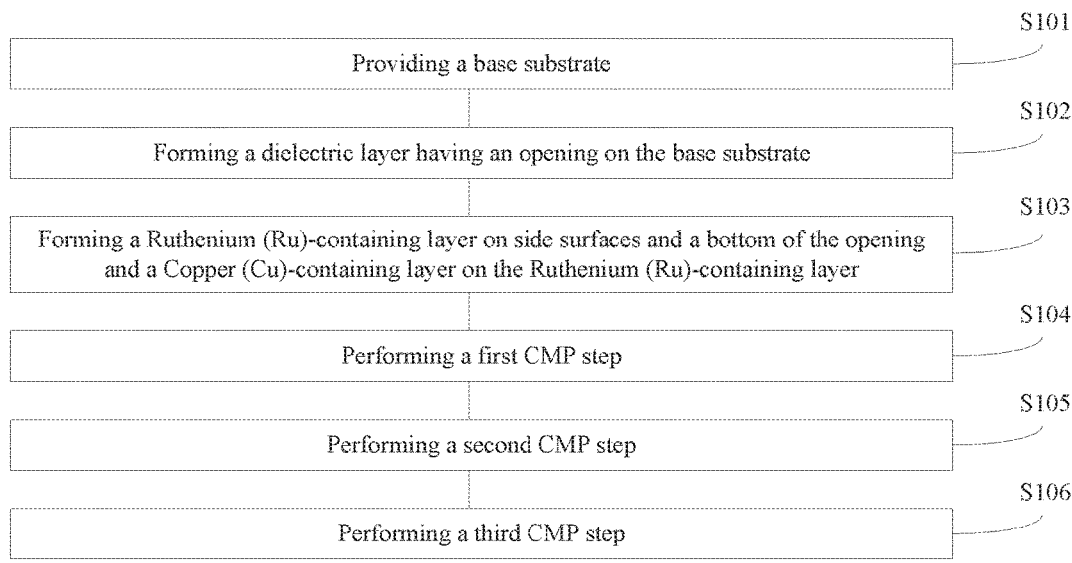
FIG. 8 illustrates an exemplary fabrication process of a semiconductor structure consistent with various disclosed embodiments of the present disclosure.

FIG. 8 illustrates an exemplary fabrication process of a semiconductor structure consistent with various disclosed embodiments of the present disclosure. FIGS. 1-7 illustrate structures corresponding to certain stages during the exemplary fabrication process.

Figure 1:
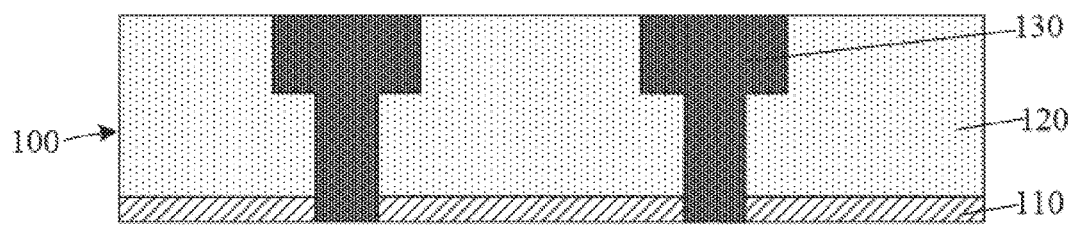
FIGS. 1-7 illustrate structures corresponding to certain stages during an exemplary fabrication process of a semiconductor structure consistent with various disclosed embodiments of the present disclosure.

As shown in FIG. 8, at the beginning of the fabrication process, a base substrate with certain structures is provided (S101). FIG. 1 illustrates a corresponding semiconductor structure.

As shown in FIG. 1, a base substrate 100 is provided. The base substrate 100 provides a base for subsequent processes.

A plurality of functional structures may be formed in the base substrate 100. For example, semiconductor devices, such as MOS fin field-effect transistors (MOSFETs), etc., and/or resistor structures may be formed in the base substrate 100.

In one embodiment, the base substrate 100 may include a bottom etching barrier layer 110, a bottom dielectric layer 120 on the bottom etching barrier layer 110, and a bottom Cu interconnect structure 130 in the bottom etching barrier layer 110.

As disclosed, the bottom etching barrier layer 110 may be made of any appropriate material, such as silicon carbonitride (SiCN), silicon oxycarbide (SiCO), or silicon nitride, etc. The bottom etching barrier layer 110 may be used to define the stop position when forming the bottom Cu interconnect structure 130.

The bottom dielectric layer 120 may be used to electrically isolate the bottom Cu interconnect structure 130. In one embodiment, the bottom dielectric layer 120 may be a porous structure. The porous structure may be made of a low dielectric constant (low-K) dielectric material, i.e., the material with a relative dielectric constant equal to, or greater than 2.6 and smaller than, or equal to 3.9, or an ultra-low-K dielectric material, i.e., the material with a relative dielectric constant smaller than 2.6. The low-K dielectric material, or the ultra-low-K dielectric material may reduce the parasitic capacitance between adjacent bottom Cu interconnect structures 130.

As disclosed, the bottom dielectric layer 120 may be made of any appropriate material, such as hydrogen (H)-containing silicon oxide (SiOH), hydrogen (H)-containing silicon oxycarbide (SiOCH), fluorine (F)-doped silicon dioxide (FSG), boron (B)-doped silicon dioxide (BSG), phosphorus (P)-doped silicon dioxide (PSG), B and P co-doped silicon dioxide (BPSG), hydrosilsesquioxane (HSQ, $(HsiO_{1.5})_n$), or poly(dimethylsiloxane) (MSQ, $(CH_3SiO_{1.5})_n$), etc. In one embodiment, the bottom dielectric layer 120 is made of an ultra-low-K dielectric material. The ultra-low-K dielectric material may be porous SiOCH.

The bottom Cu interconnect structure 130 may be electrically connected with a subsequently formed Cu interconnect structure. The bottom Cu interconnect structure 130 may also be electrically connected with an external circuit(s). In one embodiment, the top surface of the bottom Cu interconnect structure 130 may level with the top surface of the bottom dielectric layer 120.

Figure 2:
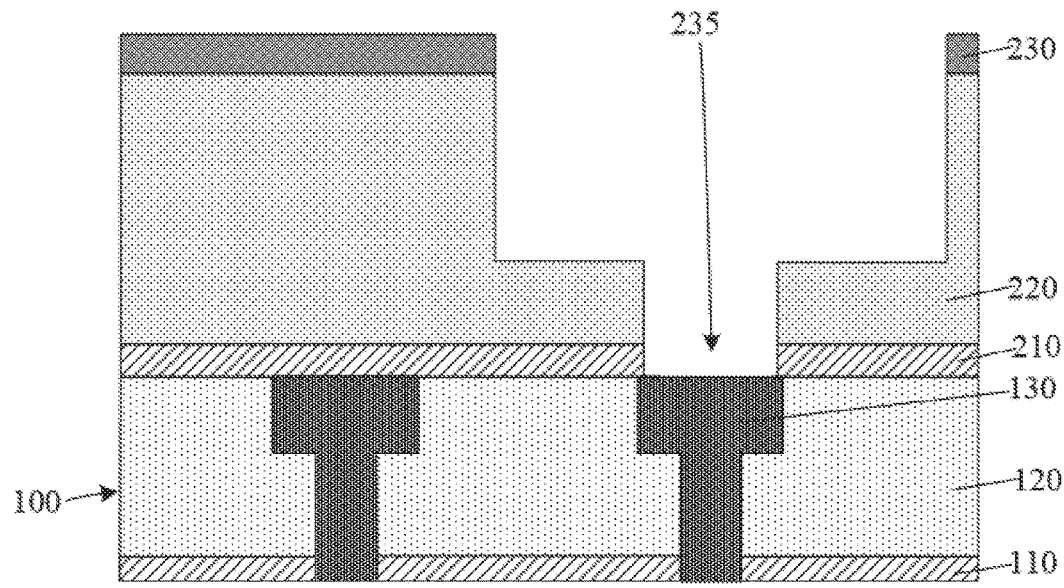

Returning to FIG. 8, after providing the base substrate with the certain structures, a dielectric layer may be formed (S102). FIG. 2 illustrates a corresponding semiconductor structure.

As shown in FIG. 2, a dielectric layer 220 is formed over the base substrate 100. An opening 235 may be formed in the dielectric layer 220.

The dielectric layer 220 may be used to electrically insulate the subsequently formed Cu interconnect structure. The opening 235 may provide a spatial position for subsequently forming a Cu interconnect structure.

As disclosed, the dielectric layer 220 may be made of any appropriate material, such as H-containing silicon oxide (SiOH), H-containing silicon oxycarbide (SiOCH), F-doped silicon dioxide (FSG), B-doped silicon dioxide (BSG), P-doped silicon dioxide (PSG), B and P co-doped silicon dioxide (BPSG), hydrosilsesquioxane (HSQ, $(HsiO_{1.5})_n$), or poly(dimethylsiloxane) (MSQ, $(CH3SiO_{1.5})_n$), etc. In one embodiment, the dielectric layer 220 is made of an ultra-low-K dielectric material. The ultra-low-K dielectric material may be porous SiOCH.

The opening 235 may be a trench, a through hole, or a combination of a trench and a through hole, etc. In one embodiment, a dual Damascene process is used to etch the dielectric layer 220 to form the opening 235. Thus, the opening 235 may include a trench (not labeled) and a through hole (not labeled). The trench and the through hole are connected; and the size of the bottom of the trench may be greater than the size of the top of the through hole, as shown in FIG. 2.

Before forming the dielectric layer 220, as shown in FIG. 2, an etching barrier layer 210 may be formed on the base substrate 100. For example, the etching barrier layer 210 may be formed on the bottom dielectric layer 120 and the bottom interconnect structure 130.

The etching barrier layer 210 may be used to define the stop position of the etching process for forming the opening 235. The etching barrier layer 210 may be made of any appropriate material, such as silicon carbonitride (SiCN), silicon oxycarbide (SiCO), or silicon nitride, etc.

Further, as shown in FIG. 2, after forming the dielectric layer 220 and before etching the dielectric layer 220 to form the opening 235, an oxide layer 230 may be formed on the dielectric layer 220.

The oxide layer 230 may be used as a buffering layer when subsequently etching the dielectric layer 200 to form the opening 235.

The dielectric layer 220 may be made of an ultra-low-K material; and the ultra-low-dielectric material may be soft and porous. Thus, an over-etching may easily happen. The oxide layer 230 may have better compactness and hardness. Depositing the oxide layer 230 may better control the thickness of the dielectric layer 220 during the subsequent etching process.

The oxide layer 230 may be made of any appropriate material. In one embodiment, the oxide layer 230 is made of silicon oxide, or plasma-enhanced tetraethyl orthosilicate (PETEOS).

In one embodiment, as shown in FIG. 2, the opening 235 may pass through the oxide layer 230, the dielectric layer 220 and the etching barrier layer 210; and may expose a portion of the bottom Cu interconnect structure 130. Thus, the subsequently formed Cu interconnect structure may electrically connect with the bottom Cu interconnect structure 130.

Figure 3:
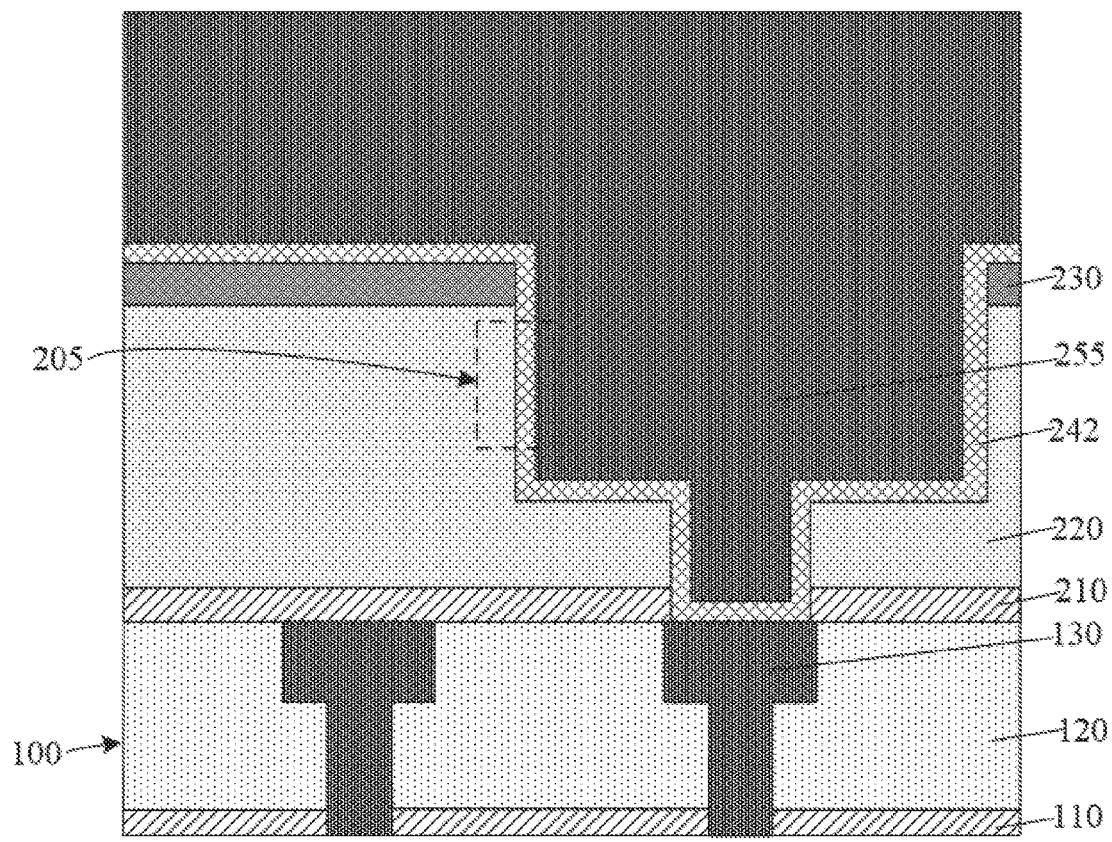

Returning to FIG. 8, after forming the dielectric layer, a Ruthenium (Ru)-containing layer may be formed (S103). FIG. 3 illustrates a corresponding semiconductor structure.

As shown in FIG. 3, a Ruthenium (Ru)-containing layer 242 is formed on the side surfaces and the bottom of the opening 235. The Ruthenium (Ru)-containing layer 242 may also cover the top surface of the oxide layer 230.

The Ruthenium (Ru)-containing layer 242 may have a desired adhesion with a Copper (Cu)-containing layer. Thus, the Ruthenium (Ru)-containing layer 242 may be used as a wetting layer for subsequently forming the Cu player; and the Copper (Cu)-containing layer may be directly electroplated. Further, the resistivity of the Ruthenium (Ru)-containing layer may be relatively low, it may facilitate improvement of the quality and performance of the subsequently formed Cu interconnect structure; and the RC delay of the Cu interconnect structure may be reduced.

In one embodiment, the Ruthenium (Ru)-containing layer 242 is formed by an atomic layer deposition (ALD) process. Thus, the Ruthenium (Ru)-containing layer 242 may have a desired step coverage performance. The Ruthenium (Ru)-containing layer 242 may also be formed by other appropriate processes.

The Ruthenium (Ru)-containing layer 242 may have a characteristic of column-growth. Thus, after filling a Copper (Cu)-containing layer in the opening 235, the Ruthenium (Ru)-containing layer 242 may provide diffusion paths at grain boundaries; and Cu may be easy to diffuse into the dielectric layer 220 through the Ruthenium (Ru)-containing layer 242.

Figure 4:
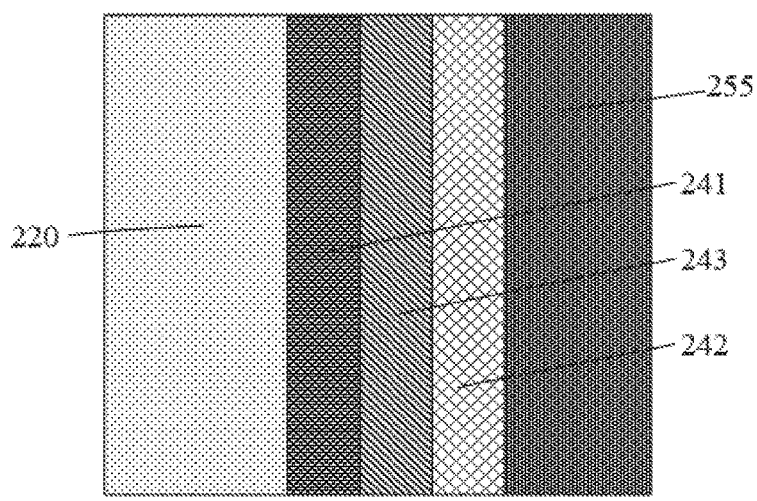

Thus, as shown in FIG. 4, which is a zoomed-in view a broken line region 205 illustrated in FIG. 3, an adhesion barrier layer 241 may be formed on the side surfaces and the bottom of the opening 235 (referring to FIG. 2) before forming the Ruthenium (Ru)-containing layer 242 to inhibit the column-growth of the Ruthenium (Ru)-containing layer 242. The adhesion barrier layer 241 may also cover the top surface of the oxide layer 230.

The adhesion barrier layer 241 may be made of any appropriate material, such as titanium nitride (TiN), or tantalum nitride (TaN), etc. In one embodiment, the adhesion barrier layer 241 is made of TiN.

Various processes may be used to form the adhesion barrier layer 241, such as a chemical vapor deposition (CVD) process, a physical vapor deposition (PVD) process, or an atomic layer deposition (ALD) process, etc.

At the interface between the adhesion barrier layer 241 and the Ruthenium (Ru)-containing layer 242, the adhesion barrier layer 241 and the Ruthenium (Ru)-containing layer 242 may inter-diffuse; and a reaction layer 243 (referring to FIG. 4) may be formed between the adhesion barrier layer 241 and the Ruthenium (Ru)-containing layer 242. The adhesion barrier layer 241 may be made of TiN. Correspondingly, the reaction layer 243 may be made of RuTiN.

Further, as shown in FIG. 3, a Copper (Cu) containing layer 255 may be formed in the opening 235 (referring to FIG. 2). The Copper (Cu)-containing layer 255 may fill the opening 235; and the Copper (Cu)-containing layer 255 may cover the Ruthenium (Ru)-containing layer 242. After a subsequent chemical mechanical polishing (CMP) process, the remaining Copper (Cu)-containing layer 255 may be used as a Cu interconnect structure.

The Copper (Cu)-containing layer 255 may be formed by any appropriate process. In one embodiment, the Copper (Cu)-containing layer 255 is formed by an electroplating process.

After the electroplating process, the Copper (Cu)-containing layer 255 may overflow out the opening 235; and may cover the Ruthenium (Ru)-containing layer 242 on the top surface of the dielectric layer 220. Thus, after forming the Copper (Cu)-containing layer 255, the portion of the Copper (Cu)-containing layer 255 above the dielectric layer 220 may be removed. Various processes may be used to remove the portion of the Copper (Cu)-containing layer 255 above the dielectric layer 220. In one embodiment, a CMP process is used to remove the portion of the Copper (Cu)-containing layer 255 above the dielectric layer 220.

The CMP process may include a plurality of CMP steps. For example, the CMP process may include, sequentially, a first CMP step, a second CMP step and a third CMP step performed on the Copper (Cu)-containing layer 255.

Figure 5:
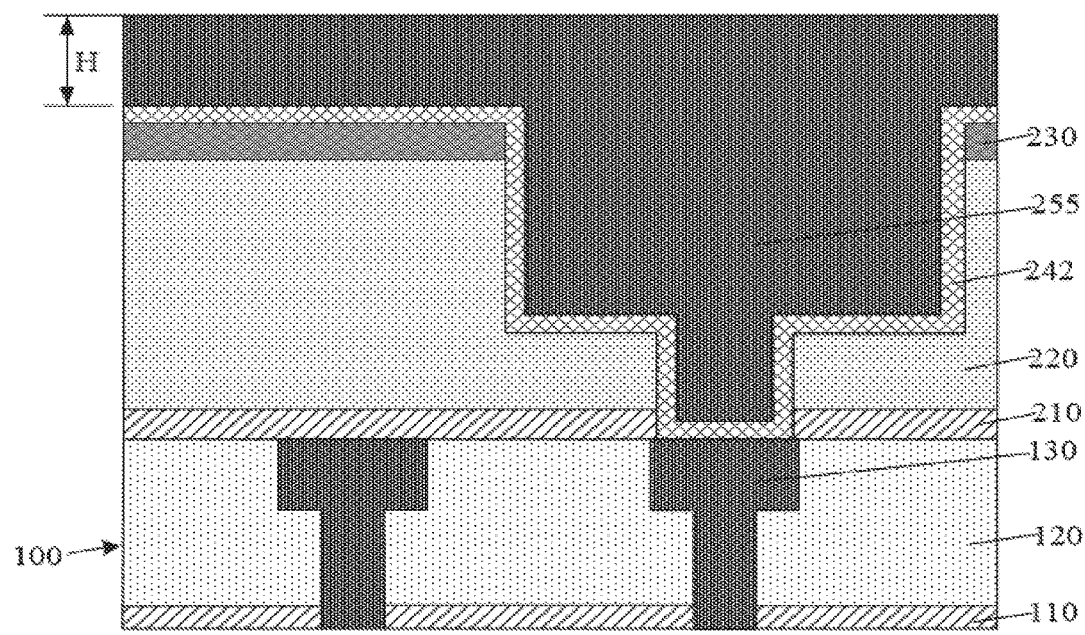

As shown in FIG. 5, the first CMP step may be performed to remove a partial thickness of the Copper (Cu)-containing layer 255 (S104). By performing the first CMP step, the partial thickness of the Copper (Cu)-containing layer 255 may be removed; and a process base may be provided for the second CMP step.

In one embodiment, to improve the polishing efficiency, the polishing pad used in the first CMP step may be a hard pad. The hard pad may refer to as the polishing pad with high rigidity and less deformation horizontally.

By controlling the process of the first CMP step, e.g., by a real time process control (RTPC), the thickness of the remaining Copper (Cu)-containing layer 255 may be controlled at a targeted value. For example, referring to FIG. 5, after the first CMP step, the distance "H" between the top surface of the remaining Copper (Cu)-containing layer 255 and the top surface of the Ruthenium (Ru)-containing layer 242 may be at a targeted value.

As disclosed, the distance "H" between the top surface of the remaining Copper (Cu)-containing layer 255 and the top surface of the Ruthenium (Ru)-containing layer 242 may be any appropriate value. If the distance "H" is too small, the flatness of the remaining Copper (Cu)-containing layer 252 may be not as desired and/or the thickness of the remaining Copper (Cu)-containing layer 252 is too small. If the distance "H" is too large, the process difficulty of the subsequent polishing processes may be increased; and the process time may be increased. Thus, in one embodiment, after the first CMP step, the distance "H" between the top surface of the remaining Copper (Cu)-containing layer 255 and the top surface of the Ruthenium (Ru)-containing layer 242 may be in range of approximately 300 Å-800 Å. That is, the thickness of the remaining Copper (Cu)-containing layer 255 on the top surface of the Ruthenium (Ru)-containing layer 242 may be in range of approximately 300 Å-800 Å.

Thus, as shown in FIG. 5, after the first CMP step, the Copper (Cu)-containing layer 255 may still cover the top surface of the Ruthenium (Ru)-containing layer 242 over the dielectric layer 220.

Because the polishing rate at the Iso area may be relatively large, the Iso area may be easy to expose the Ruthenium (Ru)-containing layer 242. As used herein, the Iso area is the region has less number of devices and/or structures. When an acidic polishing slurry is used in the first CMP step, the exposed Ruthenium (Ru)-containing layer 242 may be easily oxidized to form the poisonous and easy-to gasification $RuO_4$. Thus, to avoid forming $RuO_4$, in one embodiment, an alkali polishing slurry is used in the first CMP step.

As disclosed, the PH value of the alkali polishing slurry may be any appropriate value. If the PH value is too small, the effect for reducing the formation of $RuO_4$ may not be as desired. If the PH value is too large, an oxide layer may be easily formed on the surface of the Copper (Cu)-containing layer 255; and the polishing rate of the first CMP step to the Copper (Cu)-containing layer 255 may be reduced. Thus, the polishing efficiency may be reduced. Further, if the PH value is too large, the polishing apparatus and/or the wafer may be easily damaged; and the dielectric layer 220 may be damaged as well.

Thus, in one embodiment, the PH value of the polishing slurry used in the first CMP step may be in a range of approximately 7.5 to 10.

In one embodiment, to improve the polishing efficiency and the surface quality of the remaining Copper (Cu)-containing layer 255 after the first CMP step; and to ensure the distance H between the top surface of the remaining Copper (Cu)-containing layer 255 and the top surface of the Ruthenium (Ru)-containing layer 242 to be the targeted value, the parameters of the first polishing step may be set in appropriate ranges and to match with each other.

For example, the down force of the first CMP step may be in a range of approximately 1.5 psi-5 psi. The platen speed may be in a range of approximately 50 rpm-120 rpm. The flow rate of the polishing slurry may be in a range of approximately 100 ml/min-400 ml/min. "psi" denotes pounds per square inch; and "rpm" denotes rounds per minute.

Returning to FIG. 8, after performing the first CMP step, a second CMP step may be performed (S105). FIG. 6 illustrates a corresponding semiconductor structure.

As shown in FIG. 6, a second CMP step may be performed to remove a second partial thickness of the Copper (Cu)-containing layer 255 above the Ruthenium (Ru)-containing layer 242 to expose the Ruthenium (Ru)-containing layer 242 on the dielectric layer 220. The polishing slurry used in the second CMP step may contain a Cu-corrosion-inhibitor.

By performing the second CMP step, the portion of the remaining Copper (Cu)-containing layer 255 above the Ruthenium (Ru)-containing layer 242 on the dielectric layer 220 may be removed; and a process base may be provided for the third CMP step. Further, the second CMP step may improve the quality of the top surface of the remaining Copper (Cu)-containing layer 255 after the first CMP step. For example, the dishing issues on surface of the remaining Copper (Cu)-containing layer 255 may be reduced.

During the second CMP step, if a hard pad is used, the polishing rate may be relatively high; and the planarization effect to the surface of the Copper (Cu)-containing layer 255 may be as desired. However, the amount of the micro-scratches may be relatively large. If a soft pad is used, the amount of the micro-scratches may be relatively small. However, the polishing rate may be relatively low; and the planarization effect to the surface of the Copper (Cu)-containing layer 255 may be not as good as that obtained by the hard pad.

Thus, in one embodiment, the requirement for the polishing rate of the second CMP step may be not as high as the polishing rate of the first CMP step. Further, the requirement for the surface quality of the remaining Copper (Cu)-containing layer 255 after the second CMP step may be not as high as the requirement for the surface quality of the remaining Copper (Cu)-containing layer 255 after the third CMP step. Thus, either a soft pad or a hard pad may be used in the second CMP step. The soft pad may refer to as the polishing pad with low rigidity and large deformation horizontally.

In one embodiment, during the second CMP step, a friction force detection method or an optical endpoint detection method may be used to detect the top surface of the Ruthenium (Ru)-containing layer 242. The top surface of the Ruthenium (Ru)-containing layer 242 may be used as the stop point of the polishing process so as to remove the portion of the Copper (Cu)-containing layer 255 above the top surface of the Ruthenium (Ru)-containing layer 252.

After the second CMP step, the top surface of the remaining Copper (Cu)-containing layer 255 may have a relatively high flatness.

After the second CMP step, the Ruthenium (Ru)-containing layer 242 may be exposed on the dielectric layer 220. When an acidic polishing slurry is used, after exposing the Ruthenium (Ru)-containing layer 242, the Ruthenium (Ru)-containing layer 242 may be easily oxidized to form the poisonous and easy-gasification oxide $RuO_4$. Thus, to avoid forming $RuO_4$, an alkali polishing slurry may be used in the second CMP step.

As disclosed, the PH value of the alkali polishing slurry may be any appropriate value. If the PH value is too small, the effect for reducing the formation of RuO4 may not be as desired. If the PH value is too large, an oxide layer may be easily formed on the surface of the Copper (Cu)-containing layer 255; and the polishing rate of the second CMP step to the remaining Copper (Cu)-containing layer 255 may be reduced. Thus, the polishing efficiency may be reduced. Further, if the PH value is too large, the polishing apparatus and/or the wafer may be easily damaged; and the dielectric layer 220 may be damaged.

Thus, in one embodiment, the PH value of the polishing slurry used in the second CMP step may be in a range of approximately 7.5 to 10.

In one embodiment, to improve the polishing efficiency and the surface quality of the remaining Copper (Cu)-containing layer 255 after the second CMP step, the parameters of the second CMP step may be set in an appropriate range and to match with each other.

For example, the down force of the second CMP step may be in a range of approximately 0.8 psi-5 psi. The platen speed may be in a range of approximately 20 rpm-70 rpm. The flow rate of the polishing slurry may be in a range of approximately 100 ml/min-400 ml/min.

After the second CMP step, the Ruthenium (Ru)-containing layer 242 may be exposed. Because Cu and Ru may have an electrical potential difference; and Ru may be more active than Ru, the Copper (Cu)-containing layer 255 may function as a cathode in the polishing slurry; and the Ruthenium (Ru)-containing layer 242 may function as an anode in the polishing slurry. Thus, the Copper (Cu)-containing layer 255 may be easily corroded.

Thus, in one embodiment, a Cu-corrosion-inhibitor may be included in the polishing slurry. By including the Cu-corrosion-inhibitor, the surface of the Copper (Cu)-containing layer 255 may be protected; and the possibility of the corrosion of the Copper (Cu)-containing layer 255 may be reduced.

As disclosed, the Cu-corrosion-inhibitor may be any appropriate material, such as one or more of benzoriazole (BTA), methylbenzotriazole (TTA), or mercaptobenzotriazole (MBT), etc. In one embodiment, the Cu-corrosion-inhibitor is BTA.

Returning to FIG. 8, after performing the second CMP step, a third CMP step may be performed (S106). FIG. 7 illustrates a corresponding semiconductor structure.

As shown in FIG. 7, a third CMP step is performed to remove a third partial thickness of the Copper (Cu)-containing layer 255 above the top surface of the dielectric layer 220. The polishing slurry used in the third CMP step may contain a Cu-corrosion-inhibitor.

By performing the third CMP step, the portion of the remaining Copper (Cu)-containing layer 255 along with a portion of the Ruthenium (Ru)-containing layer 242 above the top surface of the dielectric layer 220 may be removed by a polishing process. That is, the top surface of the remaining Copper (Cu)-containing layer 255 may level with the top surface of the dielectric layer 200 after the third CMP process.

Further, as shown in FIG. 7, during the third CMP step, the portion of the Ruthenium (Ru)-containing layer 242 above the top surface of the dielectric layer 220 and the oxide layer 230 (referring to FIG. 6) may be also be removed. That is, after the third CMP step, the portion of the Copper (Cu)-containing layer 255 above the top surface of the dielectric layer 220, the portion of the Ruthenium (Ru)-containing layer 242 above the top surface of the dielectric layer 220 may be removed; and the top surface of the remaining Copper (Cu)-containing layer 255 and the top surface of the remaining Ruthenium (Ru)-containing layer 242 may both level with the top surface of the dielectric layer 220.

Ru has a relatively large hardness; and the chemical reaction of Cu and the chemical reaction of Ru may have a significantly large difference. When the commonly used polishing slurry for Cu is used in the third CMP step, the polishing rate of the third CMP step to the Copper (Cu)-containing layer 255 and the polishing rate of the third CMP step to the Ruthenium (Ru)-containing layer 242 may have a significantly large difference. The polishing rate of the third CMP step to the Ruthenium (Ru)-containing layer 242 may be smaller than approximately 10 Å/min.

Thus, in one embodiment, the polishing slurry of the third CMP step may also include a Ru-remove-rate-enhancer. The Ru-remove-rate-enhancer may increase the polishing rate of the third CMP step to the Ruthenium (Ru)-containing layer 242; and may be able to prevent the over-polishing to the Copper (Cu)-containing layer 255 when removing the Ruthenium (Ru)-containing layer 242. By using the Ru-remove-rate-enhancer, the polishing rate of the third CMP step to the Ruthenium (Ru)-containing layer 242 may be increased to a range of approximately 200 Å/min-500 Å/min.

As disclosed, the Ru-remove-rate-enhancer may include any appropriate chemicals. In one embodiment, the Ru-remove-rate-enhancer includes a guanidyl-based solution, such as $CN_3H_5/2\ H_2CO_3$, etc.

In one embodiment, to reduce the scratch defects on the surface of the remaining Copper (Cu)-containing layer 255; and improve the surface quality of the remaining Copper (Cu)-containing layer 255, a soft pad may be used as the polishing pad of the third CMP step.

In one embodiment, a fraction force detection method or a by-time controlling method may be used to control the third CMP step so as to ensure the thickness of the remaining Copper (Cu)-containing layer 255 in the opening 235 (referring to FIG. 2) at the targeted value; and to allow the top surface of the remaining Copper (Cu)-containing layer 255 and the top surface of the remaining Ruthenium (Ru)-containing layer 242 to both level with the top surface of the dielectric layer 220.

When an acidic polishing slurry is used in the third CMP step, when polishing the Ruthenium (Ru)-containing layer 242, the Ruthenium (Ru)-containing layer 242 may be easily oxidized to form the poisonous and easy-gasification oxide $RuO_4$. Thus, to avoid forming $RuO_4$, an alkali polishing slurry may be used in the third CMP step.

As disclosed, the PH value of the alkali polishing slurry may be any appropriate value. If the PH value is too small, the effect for reducing the formation of $RuO_4$ may not be as desired. If the PH value is too large, the polishing apparatus and/or the wafer may be easily damaged; and the dielectric layer 220 may be damaged. Further, an oxide layer may be easily formed on the surface of the remaining Copper (Cu)-containing layer 255; and the polishing rate of the third CMP step to the remaining Copper (Cu)-containing layer 255 may be smaller than the polishing rate to third CMP step to the Ruthenium (Ru)-containing layer 242. Accordingly, the Ruthenium (Ru)-containing layer 242 in the opening 235 may be dissolved during the third CMP step; and the Copper (Cu)-containing layer 255 may be peeled off.

The Ru-remove-rate-enhancer may be a strong alkali solution. Thus, in one embodiment, the PH value of the polishing slurry used in the third CMP step may be in a range of approximately 9 to 13.

In one embodiment, to improve the polishing efficiency and the surface quality of the remaining Copper (Cu)-containing layer 255 after the third CMP step, the parameters of the third CMP step may be set in an appropriate range and to match with each other.

For example, the down force of the third CMP step may be in a range of approximately 0.8 psi-2 psi. The platen speed may be in a range of approximately 20 rpm-70 rpm. The flow rate of the polishing slurry may be in a range of approximately 100 ml/min-400 ml/min.

Further, referring back to FIG. 4, the adhesion barrier layer 241 may be formed between the dielectric layer 220 and the Ruthenium (Ru)-containing layer 242; and the reaction layer 243 may be formed between the adhesion barrier layer 241 and the Ruthenium (Ru)-containing layer 242. Thus, during the third CMP step, the reaction layer 243 above the top surface of the dielectric layer 220 and the adhesion barrier layer 241 above the top surface of the dielectric layer 220 may also be removed by a polishing process.

The polishing rate of the third CMP step to the reaction layer 243 may be similar with the polishing rate of the third CMP step to the adhesion barrier layer 241. Thus, when removing the reaction layer 243 above the top surface of the dielectric layer 220 and the adhesion barrier layer 241 above the top surface of the dielectric layer 220, the over-polishing to the remaining Copper (Cu)-containing layer 255 may be avoided.

In one embodiment, after the third CMP process, the remaining Copper (Cu)-containing layer 255 in the opening 235 may be used as a Cu interconnect structure 250 (referring to FIG. 7). The Cu interconnect structure 250 may be used to achieve an electrical connection between semiconductor devices; and/or an electrical connection between a semiconductor device and an external circuit.

The present disclosure also provides a semiconductor structure. A corresponding semiconductor structure is illustrated in FIG. 7.

As shown in FIG. 7, the semiconductor structure may include a base substrate 100; a dielectric layer 220 on the base substrate 100; a Cu interconnect structure 250 passing through the dielectric layer 220; and a Ruthenium (Ru)-containing layer 242 between the Cu interconnect structure 250 and the dielectric layer 220 and between the Cu interconnect structure 250 and the base substrate 100. The detailed structures and intermediate structures are described above with respect to the fabrication processes.

Certain functional structures may be formed in the base substrate 100. For example, certain semiconductor devices, such as MOS field-effect transistors, etc., may be formed in the base substrate 100; and/or resistor structures may be formed in the base substrate 100.

In one embodiment, a bottom etching barrier layer 110 is formed in the base substrate 100; a bottom dielectric layer 120 is formed on the bottom etching barrier layer 110; and a bottom Cu interconnect structure 130 is formed in the bottom dielectric layer 120.

As disclosed, the bottom etching barrier layer 110 may be made of any appropriate material, such as silicon carbonitride (SiCN), silicon oxycarbide (SiCO), or silicon nitride, etc. The bottom etching barrier layer 110 may define the stop position of the process for forming the bottom Cu interconnect structure 130.

The bottom dielectric layer 120 may be used to electrically isolate the bottom Cu interconnect structure 130. In one embodiment, the bottom dielectric layer 120 may be a porous structure. The porous structure may be made of a low dielectric constant (low-K) dielectric material or an ultra-low-K dielectric material. The low-K dielectric material or the ultra-low-K dielectric material may reduce the parasitic capacitance between adjacent Cu interconnect structures 130.

As disclosed, the bottom dielectric layer 120 may be made of any appropriate material, such as SiOH, SiOCH, FSG, BSG, PSG, BPSG, HSQ, or MSQ, etc. In one embodiment, the bottom dielectric layer 120 is made of an ultra-low-K dielectric material. The ultra-low-K dielectric material may be porous SiOCH.

The bottom Cu interconnect structure 130 may be electrically connected with the subsequently formed Cu interconnect structure 250. The bottom Cu interconnect structure 130 may also be electrically connected with external circuits. In one embodiment, the top surface of the bottom Cu interconnect structure 130 may level with the top surface of the bottom dielectric layer 120.

In one embodiment, an opening (not labeled) may be formed in the dielectric layer 220. The opening may be used to provide a spatial space for forming the Cu interconnect structure 250. For example, the opening may pass through the dielectric layer 220; and may expose the bottom Cu interconnect structure 130.

The opening may be a trench, a through hole, or a combination of a trench and a through hole. In one embodiment, the opening may be formed by a dual Damascene technique. Thus, the opening may include a trench and a through hole connecting to each other. The bottom of the trench may connect to the top of the through hole; and the size of the bottom of the trench may be greater the size of the top of the through hole.

The Cu interconnect structure 250 may be used to form an electrical connection between semiconductor devices. The Cu interconnect structure 250 may also be used to form an electrical connection between a semiconductor device (s) and an external circuit (s).

The Cu interconnect structure 250 may pass through the dielectric layer 220. The top surface of the Cu interconnect structure 250 may level with the top surface of the dielectric layer 220; and may electrically connect with the bottom Cu interconnect structure 130. That is, the Cu interconnect structure 250 may be inside the opening of the dielectric layer 220.

The Ruthenium (Ru)-containing layer 242 may have a desired adhesion with the Cu interconnect structure 250. The Ruthenium (Ru)-containing layer 242 may be used as a wetting layer for growing the Cu interconnect structure 250; and Cu may be directly electroplated. Further, Ru may have a relatively low resistivity. Thus, the quality and the performance of the Cu interconnect structure 250 may be improved; and the RC delay of the Cu interconnect structure 250 may be reduced.

Further, the semiconductor structure may include an etching barrier layer 210 between the dielectric layer 220 and the base substrate 100. The etching barrier layer 210 may be used to define the stop position of the etching process for forming the opening in the dielectric layer 220. The etching barrier layer 210 may be made of any appropriate material, such as SiCN, SiCO, or SiN, etc.

Further, referring to FIG. 4, the semiconductor structure may also include an adhesion barrier layer 241 between the Ruthenium (Ru)-containing layer 242 and the dielectric layer 220 and between the Ruthenium (Ru)-containing layer 242 and the bottom Cu interconnect structure 130.

The Ruthenium (Ru)-containing layer 242 may have the characteristic of column-growth. The adhesion barrier layer 241 may be used to prevent the column-growth of the Ruthenium (Ru)-containing layer 242 so as to prevent the Ruthenium (Ru)-containing layer 242 from providing diffusion paths to the Cu interconnect structure 250 at grain boundaries. Thus, the diffusion of Cu into the dielectric layer 242 through the Ruthenium (Ru)-containing layer 242 may be avoided.

As disclosed, the adhesion barrier layer 241 may be made of any appropriate material, such as TiN, or TaN, etc. In one embodiment, the adhesion barrier layer 241 is made of TiN.

At the boundary between the adhesion barrier layer 241 and the Ruthenium (Ru)-containing layer 242, the adhesion barrier layer 241 and the Ruthenium (Ru)-containing layer 242 may have an inter-diffusion. Thus, a reaction layer 243 (referring to FIG. 4) may be formed between the Ruthenium (Ru)-containing layer 241 and the adhesion barrier layer 241. In one embodiment, the adhesion barrier layer 241 is made of TiN; and the reaction layer 243 is correspondingly made of RuTiN.

The possibility for the Cu interconnect structure 250 to have a corrosion issue may be sufficiently low. Further, during forming the Cu interconnect structure 250, the poisonous and easy-gasification oxide $RuO_4$ may be avoided.

In the present disclosure, a first CMP step, a second CMP step and a third CMP step may be sequentially performed on the Copper (Cu)-containing layer. The polishing slurry of the second CMP step and the polishing slurry of the third CMP step may contain a Cu-corrosion-inhibitor. Because Cu may be more active than Ru, when Ru is exposed in the polishing slurry, Cu may function as a cathode of the corrosion electrodes. Including the Cu-corrosion-inhibitor in the polishing slurry may reduce the possibility for the Copper (Cu)-containing layer to have a corrosion issue. Thus, the polishing quality of the Copper (Cu)-containing layer may be improved.

Further, the polishing slurry of the first CMP step, the polishing slurry of the second CMP step and the polishing slurry of the third CMP step may be all alkali polishing slurries. Comparing with using acidic polishing slurries, the poisonous and easy-gasification oxide $RuO_4$ may not be produced. Thus, the quality and the performance of the Copper (Cu)-containing layer may be improved.

Further, after the third CMP step, the remaining Copper (Cu)-containing layer in the opening may be used as the Cu interconnect structure. Thus, the quality and the performance of the Cu interconnect structure may be improved. Accordingly, the electrical properties and the yield of the semiconductor structure may be improved.

Further, the polishing slurry of the third CMP step may also contain a Ru-remove-rate-enhancer. Because the portion of the Ruthenium (Ru)-containing layer above the top surface of the interlayer dielectric layer may be removed after the third CMP step, by adding the Ru-remove-rateenhancer, the removing rate of the third CMP step to the Ruthenium (Ru)-containing layer may be increased.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    providing a base substrate;
    forming a dielectric layer having an opening on the base substrate, the opening exposing a top surface of a bottom Copper (Cu) interconnect structure in the base substrate;
    forming a Ruthenium (Ru)-containing layer on side surfaces and a bottom of the opening covering the top surface of the bottom Copper (Cu) interconnect structure and on a top surface of the dielectric layer;
    forming a Copper (Cu) containing layer to fill the opening and cover the Ruthenium (Ru)-containing layer;
    performing a first chemical mechanical polishing (CMP) step to remove a first partial thickness of the Copper (Cu)-containing layer;
    performing a second CMP step using a polishing slurry containing a Cu-corrosion-inhibitor to remove a second partial thickness of the Copper (Cu)-containing layer above the Ruthenium (Ru)-containing layer; and
    performing a third CMP step using a polishing slurry containing a Cu-corrosion-inhibitor to remove a third partial thickness of the Copper (Cu)-containing layer above the dielectric layer, wherein the polishing slurry in the third CMP step is different from the polishing slurry in the second CMP step by further including a Ru-remove-rate-enhancer.

2. The method according to claim 1, wherein:
    the bottom Copper (Cu) interconnect structure is directly connected with the Copper (Cu) containing layer through the Ruthenium (Ru)-containing layer, and
    a polishing slurry of the first CMP step, the polishing slurry of the second CMP step and the polishing slurry of the third CMP step are alkali polishing slurries.

3. The method according to claim 2, wherein:
    a PH value of the first polishing slurry is in a range of approximately 7.5 to 10.

4. The method according to claim 2, wherein:
    a PH value of the second polishing slurry is in a range of approximately 7.5 to 10.

5. The method according to claim 2, wherein:
    a PH value of the third polishing slurry is in a range of approximately 9 to 13.

6. The method according to claim 1, wherein:
    the Cu-corrosion-inhibitor includes one or more of benzoriazole (BTA), methylbenzotriazole (TTA), and mercaptobenzotriazole (MBT).

7. The method according to claim 1, wherein:
    a down of the first CMP step is in a range of approximately 1.5 psi-5 psi;
    a platen speed of the first CMP step is in a range of approximately 50 rpm-120 rpm; and
    a flow rate of a polishing slurry of the first CMP step is in a range of approximately 100 ml/min-400 ml/min.

8. The method according to claim 1, wherein:
    a thickness of a remaining Copper (Cu)-containing layer above the Ruthenium (Ru)-containing layer is in a range of approximately 300 Å-800 Å after the first CMP step.

9. The method according to claim 1, wherein:
    a down force of the second CMP step is in a range of approximately 0.8 psi-2 psi;
    a platen speed of the second CMP step is in a range of approximately 20 rpm-70 rpm; and
    a flow rate of the polishing slurry of the second CMP step is in a range of approximately 100 ml/min-400 ml/min.

10. The method according to claim 1, wherein:
    a down force of the third CMP step is in a range of approximately 0.8 psi-2 psi;
    a platen speed of the third CMP step is in a range of approximately 20 rpm-70 rpm; and
    a flow rate of the polishing slurry of the third CMP step is in a range of approximately 100 ml/min-400 ml/min.

11. The method according to claim 1, wherein:
    a hard pad is used in the first CMP step;
    a hard pad is used in the second CMP step; and
    a soft pad is used in the third CMP step.

12. The method according to claim 1, wherein performing the third CMP step further comprises:
    removing a portion of the Ruthenium (Ru)-containing layer above the dielectric layer.

13. The method according to claim 1, wherein:
    the Ru-remove-rate-enhancer includes a guanidyl-based solution.

14. The method according to claim 1,
    after forming the dielectric layer and before forming the Ruthenium (Ru)-containing layer on the bottom and the side surfaces of the opening, further comprising forming an adhesion barrier layer on the bottom and the side surfaces of the opening and on the top surface of the dielectric layer, and
    before forming the dielectric layer on the base substrate, further comprising: forming an etching barrier layer on the base substrate, wherein the opening passes through the dielectric layer and the etching barrier layer.

15. The method according to claim 14, wherein:
    the adhesion barrier layer is made of one of TiN and TaN.

16. A semiconductor structure, comprising:
    a base substrate having a bottom Copper (Cu) interconnect structure;
    a dielectric layer on the base substrate;
    a copper (Cu) interconnect structure passing through the dielectric layer;
    a Ruthenium (Ru)-containing layer between the Cu interconnect structure and the dielectric layer and between the Cu interconnect structure and the base substrate, the Ruthenium (Ru)-containing layer on a top surface of the bottom Copper (Cu) interconnect structure;
    an adhesion barrier layer between the dielectric layer and the Ruthenium (Ru)-containing layer; and
    a reaction barrier layer between the adhesion barrier layer and the Ruthenium (Ru)-containing layer.

17. The semiconductor structure according to claim 16, wherein the Cu interconnect structure is formed by:
    forming an opening passing through the dielectric layer;
    forming the Ruthenium (Ru)-containing layer on side surfaces and a bottom of the opening and on a top surface of the dielectric layer;
    forming a Copper (Cu)-containing layer on the Ruthenium (Ru)-containing layer;

performing a first chemical mechanical polishing (CMP) step to remove a first partial thickness of the Copper (Cu)-containing layer;

performing a second CMP step using a polishing slurry containing a Cu-corrosion-inhibitor to remove a second partial thickness of the Copper (Cu)-containing layer above the Ruthenium (Ru)-containing layer; and performing a third CMP step using a polishing slurry including a Cu-corrosion-inhibitor to remove a third partial thickness of the Copper (Cu)-containing layer above the dielectric layer, wherein the polishing slurry in the third CMP step is different from the polishing slurry in the second CMP step by further including a Ru-remove-rate-enhancer.

18. The semiconductor structure according to claim 16, further comprising:

an etching barrier layer over the base substrate.

19. The semiconductor structure according to claim 17, wherein:

the second CMP step and the third CMP step do not generate $RuO_4$.

* * * * *